United States Patent [19]

Erickson

[11] Patent Number: 4,516,223
[45] Date of Patent: May 7, 1985

[54] HIGH DENSITY BIPOLAR ROM HAVING A LATERAL PN DIODE AS A MATRIX ELEMENT AND METHOD OF FABRICATION

[75] Inventor: Donald A. Erickson, Garland, Tex.

[73] Assignee: Texas Instruments Incorporated, Dallas, Tex.

[21] Appl. No.: 289,357

[22] Filed: Aug. 3, 1981

[51] Int. Cl.³ .............................................. G11C 11/36
[52] U.S. Cl. ...................................... 365/175; 365/105
[58] Field of Search .................................. 365/105, 175

[56] References Cited

U.S. PATENT DOCUMENTS

| | | | |
|---|---|---|---|
| 3,384,879 | 5/1968 | Stahl et al. | 365/105 |
| 3,689,900 | 9/1972 | Chen | 365/105 |
| 4,420,820 | 12/1983 | Preedy | 365/105 |
| 4,424,579 | 1/1984 | Roesner | 365/105 |

Primary Examiner—Terrell W. Fears

Attorney, Agent, or Firm—Richard A. Bachand; N. Rhys Merrett; Melvin Sharp

[57] ABSTRACT

A bipolar ROM having a polysilicon PN junction diode as the matrix element for each bit of storage, wherein the diode is constructed laterally to the associated word line of the array. The word line and diode are implanted with impurities, then metal is deposited on the exposed surfaces of the polysilicon and the structure undergoes a sintering process. A layer of oxide covers the structure and a metal bit line connection is made to the diode P-type section, while the word line and other section of the diode are N-type. P and N type regions may be interchanged, as the polarity of a bit line or word line is a function of drive and sense circuitry. This combination of structure and method allows the use of polysilicon because of the lower sheet resistance and higher speed. Also, the use of PN junction diodes is possible instead of a design requiring Schottky diodes or transistors as matrix elements.

2 Claims, 9 Drawing Figures

HIGH DENSITY BIPOLAR ROM HAVING A LATERAL PN DIODE AS A MATRIX ELEMENT AND METHOD OF FABRICATION

BACKGROUND OF THE INVENTION

This invention relates to semiconductor read-only memories in general, and more specifically to mask-programmable semiconductor read-only memories. Mask-programmable read-only memories currently in use today are generally fabricated having a Schottky diode or a transistor device as elements of the matrix. The desired bit pattern for this type of ROM is programmed at the interconnect level to determine the logic level output from each particular matrix element. The use of polysilicon junction diodes as logic elements has been described elsewhere (K. Okada et al., "PSA—A New Approach for Bipolar LSI", IEEE; J. Solid State Circuits, vol. SC—13, pp. 6793–6981, Oct. 1978) and the characteristics of such diodes have been reported (J. Manoliu and T. I. Kamins, "P-N Junctions in Polycrystalline-Silicon Films", Solid-State Electron., vol. 15, pp. 1103–1106, 1972; M. Dutoit and F. Sollberger, "Lateral Polysilicon P-N Diodes", Electrochem. Soc., vol. 125. pp 1648–1651, 1978; H. S. deGraaff and J. G. deGroot, "Polycrystalline Devices in Bipolar IC Technology," in IEEE IEDM Conf., Dig. Tech. Papers, pp. 46–49, Dec. 1980). The use of such a diode as a ROM matrix element requires low reverse leakage current, low polysilicon sheet resistance to allow use as interconnect, and suitable forward characteristics, the combination of which has not been reported or demonstrated elsewhere. The present invention incorporates these features to allow fabrication of high density, high speed ROM's using the polysilicon diode matrix element.

SUMMARY OF THE INVENTION

One aspect of the present invention is embodied in a mask-programmable bipolar ROM array having a polysilicon PN diode as the matrix element. To overcome the problems associated with the high sheet resistance of polysilicon, there is a novel combination of materials and methods of fabrication of the ROM matrix wherein a silicide layer is grown in a self-aligned fashion to but not in the PN junction areas, which significantly reduces the sheet resistance of the polysilicon and the series resistance of the diode forward current versus voltage characteristic. The PN junction is formed on a wider section of, and in a lateral direction from, a polysilicon strip, rather than in a vertical direction. This new combination of materials and location of elements allows the use of polysilicon PN junction diodes as matrix elements, and additionally gives a higher packing density, and higher speed owing to the low resistance of the polysilicon/silicide, low minority carrier lifetime of the polysilicon lateral diode, and reduced parasitic capacitance coupling to the semiconductor substrate.

DETAILED DESCRIPTION OF THE PREFERRED EMBODIMENT

Figure 1:
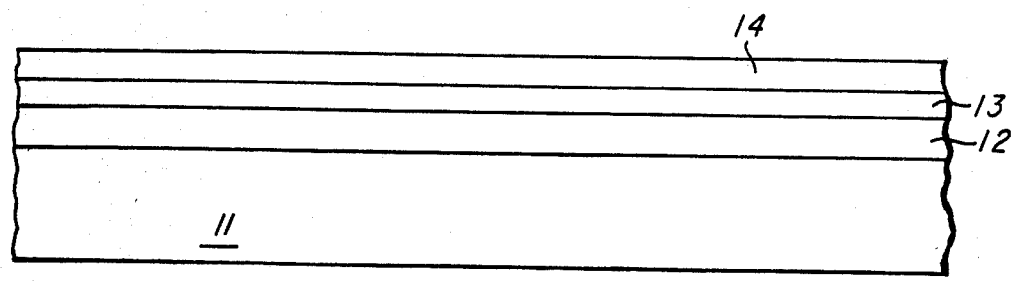
FIG. 1 shows the initial depositions of material.
Figure 2:
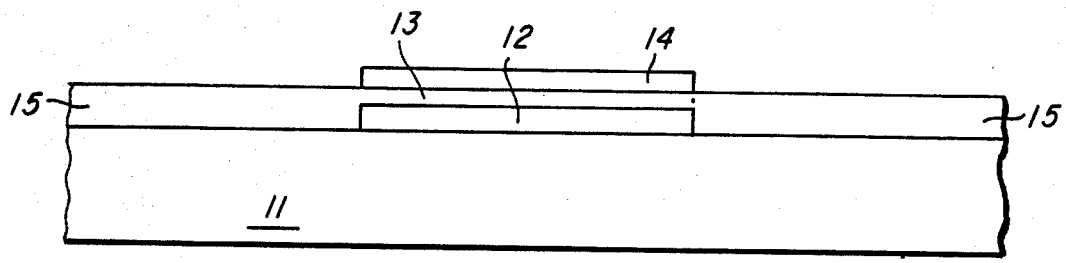
FIG. 2 shows the structure after selective conversion of the polysilicon to SiO$_2$.

Referring to FIG. 1, there is shown a silicon substrate 10 on which a layer of silicon dioxide 11 is grown with thickness of 1.0 micron to 2.0 micron. On layer 11 is deposited a polysilicon film 12 having a thickness of 1500 Å to 5000 Å, preferably about 2500 Å. On top of the polysilicon is grown a layer of silicon dioxide 13, 200 Å to 3000 Å thick, preferably 1500 Å. Over the oxide is then deposited a layer of silicon nitride 14, 500 Å to 1500 Å thick, preferably 1000 Å. Conventional photolithography and plasma etch is used to define the word line and lateral polysilicon diode pattern in the nitride. Silicon dioxide 15 is then grown in those areas not covered by the nitride 14 to a thickness of 3000 Å to 7000 Å, preferably 5500 Å as shown in FIG. 2.

Figure 3:
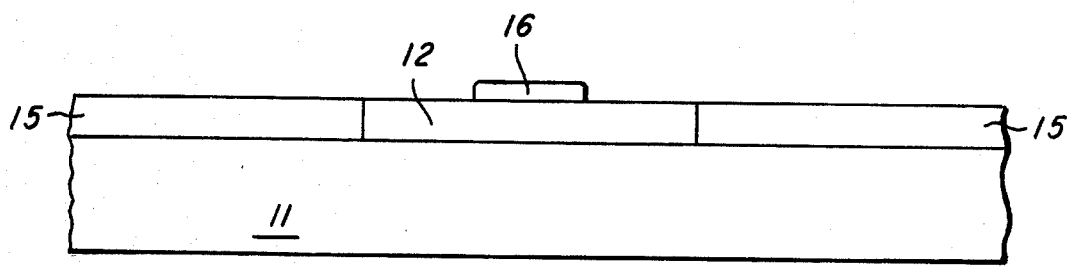
FIG. 3 shows the structure after the nitride is removed and a selective etch done to leave an oxide pad on the polysilicon.
Figure 4:
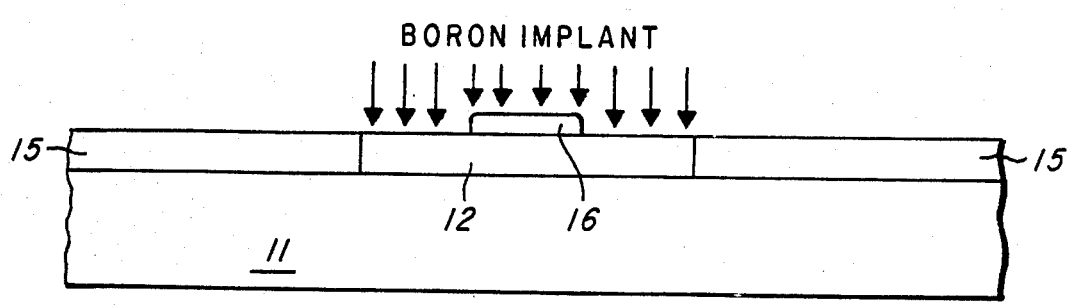
FIG. 4 shows the implant of an impurity which creates P-type material.
Figure 5:
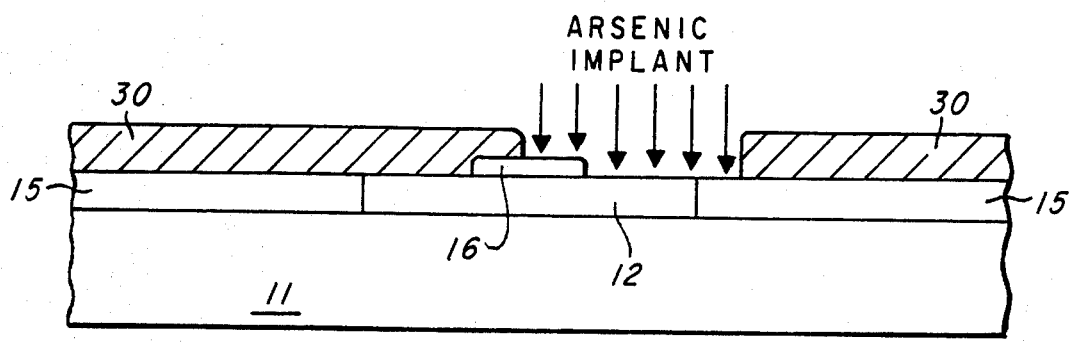
FIG. 5 shows the photoresist mask and the impurity implant which will create N-type material.
Figure 6:
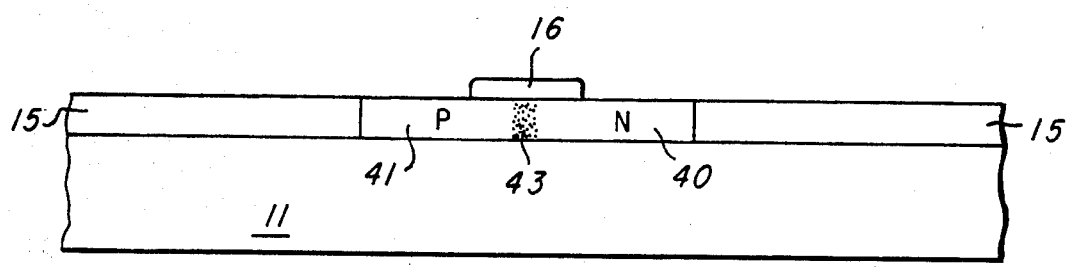
FIG. 6 shows the polarities of the structure after annealing.
Figure 7:
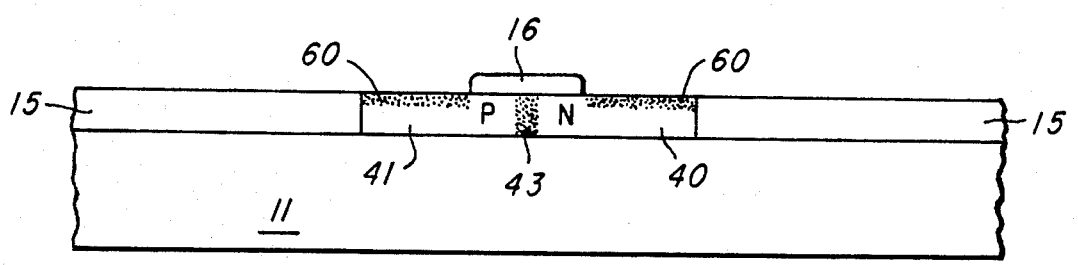
FIG. 7 shows the sintered structure.
Figure 8:
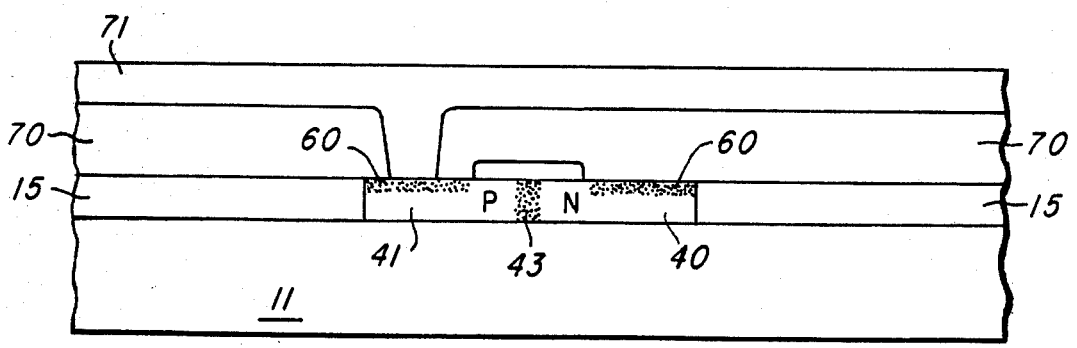
FIG. 8 shows the structure with the interlevel SiO$_2$ in place and the second level interconnect coupled to the P-section of the device.
Figure 9:
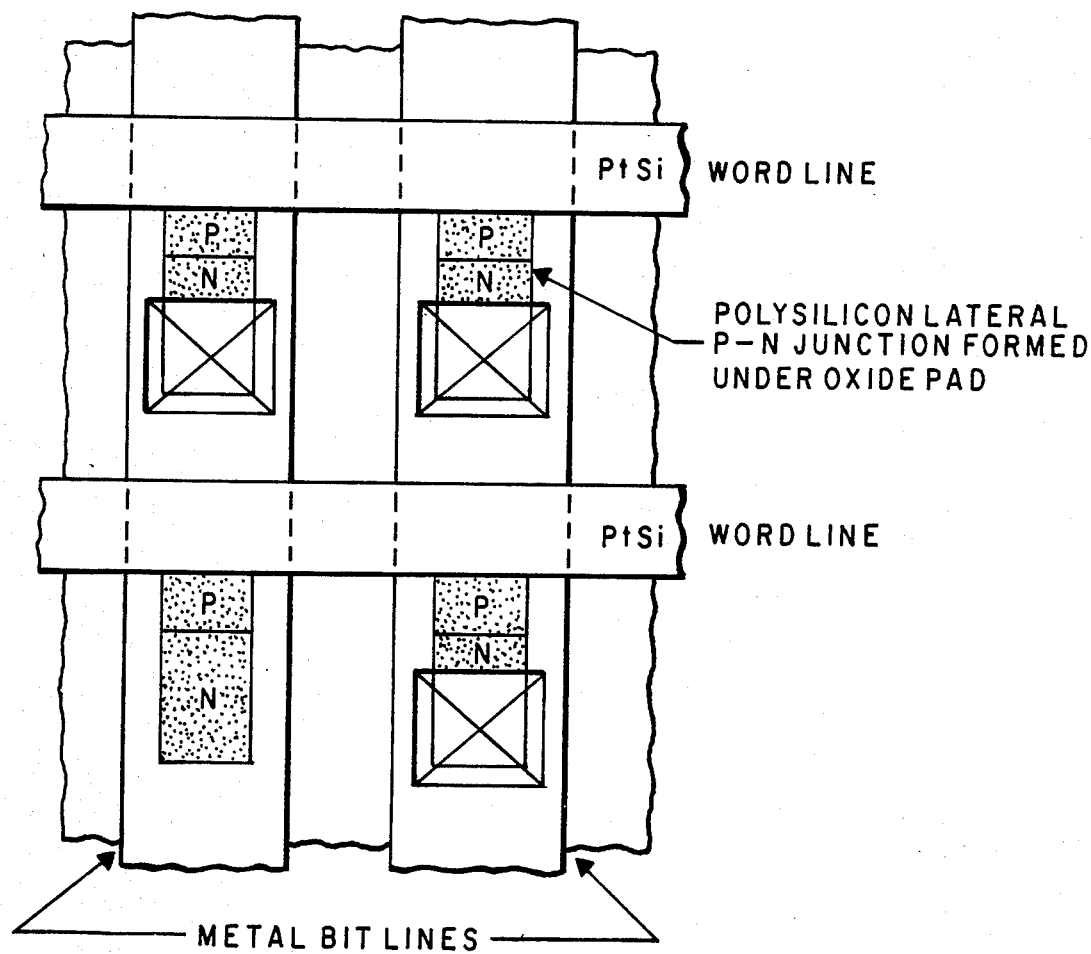
FIG. 9 is a top view of the array structure showing the layout of the addressing lines and the array elements.

The silicon nitride layer is removed and a selective etch is done to remove all oxide 13 from the polysilicon etch except for the oxide pad 16 under which a PN junction will be formed. The resulting structure is shown in FIG. 3. The use of selective oxidation to pattern the polysilicon results in a planar surface. A non-selective implant of P-type dopant, such as boron is done which dopes all polysilicon P-type as shown in FIG. 4. In FIG. 5 there is shown the photoresist 30 for masking during the implant of an N-type impurity, such as arsenic with oxide pad 16 forming part of mask. After removal of the photoresist, the structure is annealed and the result is as shown in FIG. 6. A PN junction 43 exists between P-type material 41 and N-type material 40. Metal such as platinum is now deposited and sintering done to form silicide on exposed polysilicon. Metal remaining over oxide layers is then removed resulting in the structure shown in FIG. 7 with the polysilicon/silicide layer 60 forming contact to the lateral diode anode and cathode regions in a self aligned fashion to the junction and also allowing use of the polysilicon as a word line because of the greatly reduced resistance. The last steps of the process call for an interlevel layer of insulator, for example, silicon dioxide 70 as shown in FIG. 8. An etch through this layer to the P-type material is done, and a connection made to a metal bit line 71 if called for in the particular bit pattern desired. The metal bit in FIG. 9, this top view of the array arrangement shows the transverse orientation of the bit lines to the word lines. The bit lines are connected to the P+ region of the array diodes by means of a via etched through the insulating layer of oxide. These connections are made only when the programming for the desired output requires it.

The use of polysilicon to form a matrix element has not previously been attempted because of the high sheet resistance of the material, which has a negative effect on high speed operation and density. The structure and method of fabrication of the present invention have provided an efficient solution to that problem as well as improving basic diode characteristics due to self aligned nature of anode and cathod contacts. Additionally, this structure has the characteristics that adapt well to high density, and the fabrication processes are compatible with the fabrication techniques for Schottky-Transistor logic (STL), Integrated Schottky Logic (ISL), transistor-transistor logic (TTL), emitter-coupled logic (ECL), and Integrated Injection Logic (I2L) for interface, decode, and other peripheral circuit applications.

What is claimed is:

1. A semiconductor read-only memory comprising:
   a silicon subtrate;
   a first addressing means, comprising an N-type polysilicon region in said substrate;
   a second addressing means, comprising a strip of conductive material on said substrate;
   a laterial polysilicon PN junction diode, the P-type region being coupled to one of said addressing means, the N-type region being coupled to another of said addressing means, and the PN junction being located laterally between said P-type and N-type regions within said substrate.

2. A semiconductor read-only memory array as in claim 1, wherein said strip of conductive material is aluminum.

* * * * *